United States Patent [19]
Tanaka

[11] Patent Number: 5,881,165
[45] Date of Patent: Mar. 9, 1999

[54] PROCESS FOR THE POSITIONING OF A MASK RELATIVE TO A WORKPIECE AND DEVICE FOR EXECUTING THE PROCESS

[75] Inventor: Yoneta Tanaka, Yokohama, Japan

[73] Assignee: Ushiodenki Kabushiki Kaisha, Tokyo, Japan

[21] Appl. No.: 715,966

[22] Filed: Sep. 19, 1996

[30] Foreign Application Priority Data

Sep. 19, 1995 [JP] Japan ................................ 7-239783

[51] Int. Cl.⁶ ..................................................... G06K 9/00
[52] U.S. Cl. ........................................................... 382/151
[58] Field of Search ................................... 382/141, 144, 382/145, 151, 152; 250/201, 200, 215, 216, 222, 237; 356/150, 400, 401, 399, 140; 29/578, 579, 574; 355/93, 43, 40, 41, 61, 62, 63

[56] References Cited

U.S. PATENT DOCUMENTS

| | | | |
|---|---|---|---|
| 4,441,250 | 4/1984 | Imahashi | 29/578 |
| 4,492,459 | 1/1985 | Omata | 355/43 |
| 4,616,130 | 10/1986 | Omata | 250/201 |
| 4,699,515 | 10/1987 | Tanimoto et al. | 356/40 |
| 4,814,829 | 3/1989 | Kosugi et al. | 355/43 |

*Primary Examiner*—Jose L. Couso
*Assistant Examiner*—Duy M. Dang
*Attorney, Agent, or Firm*—Sixbey, Friedman, Leedom & Ferguson; David S. Safran

[57] ABSTRACT

A process for positioning a mask relative to a workpiece in which positioning can be done with high accuracy, and which can be advantageously used for step and repeat exposure. An improved device for executing the process of the present invention is also provided. The invention includes a reflection component positioned on a workpiece carrier in a position removed from the workpiece attachment site. The exposure light from an exposure light irradiation device is projected onto the mask and alignment marks provided on the mask are projected onto the reflection component. The alignment mask projection images are detected, their relative positions are stored, and emission of the exposure light terminated. The workpiece carrier, on which a workpiece is placed, is moved into a position in which the mask alignment marks are projected onto the workpiece. Furthermore, nonexposure light is emitted onto the alignment marks of the workpiece, the workpiece alignment marks are detected and their relative positions are determined. Then the workpiece and/or the mask are/is moved such that the mask and workpiece alignment marks come to rest on top of one another.

5 Claims, 13 Drawing Sheets

H: normal height of the workpiece

PROCESS FOR THE POSITIONING OF A MASK RELATIVE TO A WORKPIECE AND DEVICE FOR EXECUTING THE PROCESS

BACKGROUND OF THE INVENTION

1. Field of the Invention

The invention relates to a process for positioning a mask relative to a workpiece and a device for executing the process in an exposure device which is used for production of a semiconductor device, a printed board, an LCD (liquid crystal display) and for similar purposes.

2. Description of Related Art

Production of electrical and electronic components and parts of various types in which processing of structures in the micron range is necessary includes an exposure process. These electronic parts are semiconductor components, liquid crystal displays, printer heads of the inkjet type, and multichip modules in which a host of different electronic components are produced on a substrate and thus a module is formed, and the like.

In this exposure process, it is important, in the case of transmission of the mask pattern onto the workpiece, that a pattern to be subsequently transferred is positioned exactly to a pattern formed beforehand.

The above described positioning is conventionally done such that the alignment marks of the mask and the workpiece come to lie on top of one another.

As automated devices for transferring a mask pattern, exposure devices of the projection type are known wherein positioning is done using exposure light, for example of an i-line, an h-line or a g-line (i-line: 365 nm wavelength, h-line: 405 nm wavelength, g-line: 436 nm wavelength), or wherein positioning is done using nonexposure light, as, for example, an e-line, a d-line or a c-line (e-line: 546 nm wavelength, d-line: 588 nm wavelength, c-line: 656 nm wavelength).

In the aforementioned devices, in the area used for positioning, a circuit pattern cannot be formed since the photoresist is exposed to the action of exposure light during positioning.

In the case in which the yield from a workpiece is to be a host of chips, as in semiconductor components, the number of chips decreases according to the area used for positioning. Therefore, the disadvantage arises that production efficiency is impaired. On the other hand, in these devices, there is the advantage that the region of the circuit patterns is not limited by the positioning region, since the photoresist is not exposed to the action of exposure light during positioning.

However, it is considered disadvantageous that, as a result of the different wavelengths of the exposure light and the nonexposure light, the mask pattern is not projected onto the same site.

FIG. 11 shows, schematically, an arrangement of the conventional exposure device in which positioning is done using the above described e-line. In the drawing reference number 1 indicates an exposure light irradiation device or a nonexposure light irradiation device; reference number 1a, a lamp; reference number 1b, a focussing mirror; reference number 1c, a shutter; reference number 1d, an optical filter; and reference number 1e, a condenser lens.

Furthermore, reference number 2 indicates a mask carrier on which mask M is attached by means of a vacuum chuck or the like and which is driven by means of a drive device not shown in the drawing in the X-Y-Z-directions (X axis and Y axis being orthogonal axes on the plane parallel to one mask surface; Z axis being the axis in the vertical direction in FIG. 11; θ axis being the axis of rotation around the Z-axis).

On mask M, a mask pattern and mask alignment marks MAM, hereinafter referenced to as mask marks, are recorded for purposes of positioning.

Reference number 3 indicates a projection lens and reference letter W indicates a workpiece. Workpiece alignment marks WAM, hereinafter referenced to as workpiece marks, are recorded on workpiece W for purposes of positioning.

Reference number 5 indicates an alignment unit which consists of lens 5a, objective lens 5b, half mirror 5c and image converter 5d which has a CCD camera. Workpiece mark WAM and mask mark MAM, which is projected onto the workpiece W, are detected via half mirror 5c, objective lens 5b and lens 5a by means of image converter 5d, and thus the positions of the two marks are observed.

In FIG. 11, alignment unit 5 is shown only once. However, there are several alignment units 5 (at least at two locations) since there are several mask marks MAM and several workpiece marks WAM (each at least at two locations) each on mask M and workpiece W, and because alignment unit 5 is assigned according to the respective alignment mark.

Furthermore, alignment units 5 are ordinarily formed such that they can be removed in the direction of the arrow according to FIG. 11. During exposure, alignment units 5 are removed when they extend within the exposure area.

Alignment units 5 can be located in area B as shown. Moreover, they can also be located in additionally shown area A or area C.

In FIG. 11 when workpiece W is exposed, the e-line, as nonexposure light, is emitted first from exposure light (or nonexposure light) irradiation device 1 via optical filter 1d and, by means of alignment units 5, workpiece marks WAM and mask marks MAM, projected onto workpiece W, are detected. This method of determining mask marks MAM projected onto the workpiece by the projection lens is called TTL, i.e., the "through the lens", method.

In the case of auto alignment, by means of a control device which is not shown in the drawing, based on the features of mask marks MAM and workpiece marks WAM, the respective marks are recognized and mask carrier 2 and/or a workpiece carrier 4 are automatically moved such that the positions of the two marks agree with one another.

In the case of manual alignment, detected mask marks MAM and workpiece marks WAM are displayed on a monitor, which is not shown in the drawing, and by watching the monitor, an operator moves mask carrier 2 and/or workpiece carrier 4 such that the two marks agree with one another.

After completed positioning, optical filter 1d is removed from the optical path, the i-line, as exposure light, is then emitted from exposure light (or nonexposure light) irradiation device 1, the mask pattern is projected onto workpiece W, and exposure is effected.

In the case of using the i-line as the exposure light and the e-line as the nonexposure light, as a result of the different wavelengths of the two lines, the following disadvantages arise in the above described positioning:

1) In a projection lens which is designed such that at exposure wavelengths no imaging error or aberration occurs, at nonexposure wavelengths, a deviation of the mask pattern projection surface takes place. This means that the mask pattern is not projected onto the same surface as is illustrated in FIG. 11 wherein the pattern is projected on surfaces I and E.

2) The positions of mask marks MAM' on mask pattern projection surface E by the e-line, and the positions of mask marks MAM on mask pattern projection surface I by the i-line, do not agree with one another as a result of the chromatic aberration of the magnification factor.

This means that the distance between projection lens 3 and mask pattern projection surface E by the e-line becomes greater than the distance between projection lens 3 and mask pattern projection surface I by the i-line, and distance Le of mask marks MAM' on mask pattern projection surface E by the e-line becomes greater than distance Li of mask marks MAM on mask pattern projection surface I by the i-line, as shown in FIG. 11.

Furthermore, the positions of the projection images of mask marks MAM' on mask pattern projection surface E are changed by the locations of the alignment marks. This means that different values are obtained for distances ΔL and ΔL' between the workpiece marks and projected mask marks, as illustrated in FIG. 12.

Conventionally, therefore, the deviation of the projection surfaces is corrected by inserting a parallel flat plate in the optical path of the projection optics system and, according to the wavelengths of the nonexposure light, by changing the plate thickness or adjusting the plate tilt (JP patent HEI 5-43168 and corresponding U.S. Pat. No. 4,616,130).

In the above described prior art, the deviation of the projection images by the exposure light and the nonexposure light is corrected by inserting the parallel flat plate between the projection lens and the workpiece. The property being that, by inserting the parallel flat plate in the optical path, the focal position deviates by ΔS, as is illustrated in FIG. 13.

The above described prior art, however, has the following disadvantages:

(1) As is shown in FIG. 12, the positions of the projection images of the mask marks are changed by the nonexposure light depending on the positions of the alignment marks. It is therefore necessary to insert the parallel flat plate between the mask and the projection lens, to adjust its tilt and to correct the position deviation by the positions of the alignment marks, as is shown, for example, using the conventional device.

(2) When the wavelength for exposure and the wavelength for alignment change, the amount of focal length correction changes. It is therefore necessary to make available the parallel flat plate according to a combination of the above described wavelengths.

(3) To adjust the magnification factor, an optical component is used which consists of the parallel flat plate. It is therefore necessary to additionally use a retaining device for this purpose. Especially in the case in which the optical component is inserted and removed again, does the disadvantage arise that the device becomes complex and too large at the same time.

(4) The disadvantage arises that the workpiece is contaminated by dust because directly above the workpiece is the insertion device of the parallel flat plate.

As was described above, positioning using the nonexposure light has the advantage that the pattern can be formed in the vicinity of the alignment marks. But then it is necessary to correct the length of the optical path using the parallel flat plate and the like. This results in various disadvantages.

Furthermore, in the conventional process in which the relative positions of the two alignment marks are determined in the state in which the mask mark is projected onto the workpiece provided with the workpiece marks, the disadvantage arises that when auto alignment is done, the control device only recognizes the workpiece marks with difficulty.

To eliminate the above described disadvantages, the applicant has already proposed the device shown in FIG. 14 (JP patent application HEI 6-294279 and corresponding U.S. Pat. application No. 08/564,005).

In the drawing, the same parts as in FIG. 11 are provided with the same reference numbers as in FIG. 11. Reference number 1 indicates the exposure light (or nonexposure light) irradiation device, reference number 2 indicates the mask carrier, reference letter M indicates the mask on which a mask pattern and the mask alignment marks MAM are recorded for positioning. Reference number 3 indicates the projection lens and reference letter W indicates the workpiece on which workpiece marks WAM are recorded for purposes of positioning. Furthermore, reference number 4 indicates the workpiece carrier on which total reflection or half mirror 4a is installed and which is driven by means of a drive device which is not shown in the drawing in the X-Y-Z-θ directions.

Reference symbol WA1 indicates an alignment mark partial illumination system. The nonexposure light which is emitted from a light source not shown in the drawing is incident via optical fibers 6a, lens 6b and mirror 6c on half mirror 5e of alignment unit 5 and irradiates workpiece mark WAM on workpiece W.

Exposure will now be described using the device shown in FIG. 14:

(1) Mask M is placed on mask carrier 2 and attached. Shutter 1c of exposure light (or nonexposure light) irradiation device 1 is opened in the state in which optical filter 1d in the optical path is removed. Exposure light is emitted onto mask M. In this process, step workpiece W is not placed on workpiece carrier 4.

(2) The position of workpiece carrier 4 is shifted in the Z-direction such that the reflection surface of mirror 4a installed in workpiece carrier 4 agrees with mask pattern projection surface Zo by the exposure light.

(3) Alignment unit 5 is inserted. Alignment mark partial illumination system WA1 is arranged integrally with alignment unit 5 and is inserted together with alignment unit 5.

(4) By means of image converter 5d of alignment unit 5, mask mark MAM, projected onto mirror 4a of workpiece carrier 4, is detected. An image processing part, not shown in the drawing, identifies mask mark MAM based on the detected image and stores the position coordinates thereof (XM, YM).

(5) Shutter 1c of exposure light (or nonexposure light) irradiation device 1 is closed. In this way emission of exposure light onto mask M is stopped.

(6) Workpiece W is placed on workpiece carrier 4 and attached.

(7) Workpiece carrier 4 is moved in the Z-axis direction such that the surface of workpiece W agrees with mask pattern projection surface Zo.

(8) Illumination light is supplied to alignment mark partial illumination system WA1. Workpiece mark WAM on workpiece W is irradiated via optical fibers 6a, lens 6b, mirror 6c, half mirror 5e, lens 5b and half mirror 5c, and is detected by means of image converter 5d.

The image of workpiece mark WAM, detected by means of image converter 5d, is sent to the above described image processing part which identifies workpiece mark WAM and determines its position coordinates (XW, YW).

(9) Emission of the illumination light of alignment mark partial illumination system WA1 is stopped.

(10) The position deviation of workpiece W and mask M is determined on the basis of stored position coordinates (XM, YM) of mask mark MAM and determined position coordinates (XW, YW) of the workpiece mark.

As a result of the above described position deviation, mask carrier 2 and/or workpiece carrier 4 is/are driven in the X-Y-Z-θ directions and the position of mask mark MAM is brought into agreement with the position of workpiece mark WAM.

With the above described agreement of the position of mask mark MAM with the position of workpiece mark WAM, alignment unit 5 is removed. Shutter 1c of exposure light (nonexposure light) irradiation device 1 is opened, the exposure light is emitted onto mask M, and thus exposure is effected.

In the case of using the above described exposure for a step and repeat process in which each exposure zone on the workpiece is exposed in steps by moving the workpiece, according to above described process (10), the following processes are also performed, the processes of (8) through (15) are repeated, and exposure of the respective exposure zone is effected.

(11) Alignment unit 5 is removed.
(12) Shutter 1c of exposure light (nonexposure light) irradiation device 1 is opened, the exposure light is emitted onto mask M, and thus exposure is effected.
(13) Shutter 1c of exposure light (nonexposure light) irradiation device 1 is closed, and emission of exposure light is stopped.
(14) Workpiece carrier 4 is moved in a certain amount in order that the next exposure zone is positioned in a stipulated exposure position.
(15) Alignment unit 5 is inserted. There is a return to above described process (8). Processes (8) through (15) are repeated and the respective exposure zone on the workpiece undergoes step and repeat exposure.

The above described technique suggested previously by the applicant does have the advantages that no parallel flat plate is used and that positioning of the mask to the workpiece can be done independently of the projection lens and with high precision. In the case of its use for the above described step and repeat exposure, however, the following disadvantage arises:

In the case of using the previously suggested exposure process for step and repeat exposure, it is necessary to insert and remove alignment unit 5 when each exposure is effected. As a result, the reproducibility of the insertion position of alignment unit 5 is important.

FIG. 15 schematically shows a case in which the stopping position of alignment unit 5 changes. When the stopping position of alignment unit 5 is identical to the position in FIG. 15 by the broken line, the imaging position of mask mark MAM (or of workpiece mark WAM) on image converter 5d, changes accordingly.

In the above described step and repeat cycle of processes (8) through (15), in step and repeat exposure, only the positions of workpiece mark WAM are, however, detected and stored starting the second time. Therefore, in this case, it is possible that deviations occur from the position of mask mark MAM which was stored the first time.

In step and repeat exposure, the alignment accuracy is usually roughly ±1 micron. A positioning accuracy of alignment unit 5 of roughly ±0.1 microns (roughly 1/10 of the accuracy of alignment of mask M to workpiece W) is necessary in order that the deviations of workpiece marks WAM from the stored position of mask mark MAM lie within this range. It is difficult to do this mechanically with each insertion and removal of alignment unit 5.

The above described disadvantage is, on the other hand, eliminated by the position of mask mark MAM being stored in each step and repeat cycle. However, in the above described case, the sequence of storing the position of mask mark MAM by emission of exposure light cannot be done because, beginning with the second step and repeat cycle, workpiece W is attached to workpiece carrier 4.

SUMMARY OF THE INVENTION

The invention was made in order to eliminate the above described disadvantages of the prior art and, specifically, the above described disadvantage with respect to the reproducibility of the insertion position of the alignment units.

Therefore the first object of the invention is to provide a process, and a device for executing the process, which positions a mask relative to a workpiece in which the positioning of the mask can be done without using a parallel flat plate, regardless of the characteristic of the projection lens, and with high precision. Also, the process can be advantageously used for step and repeat exposure.

A second object of the invention is to devise a process, and a device for executing the process, which positions a mask relative to a workpiece in which, even in the case of difficult identification of workpiece marks, as in the case of overlapping of mask marks with the workpiece marks or the like, the relative positions of the mask marks and the workpiece marks can be easily and automatically determined and positioning can be done with high precision within a short time.

The above described objects are achieved according to the invention by a reflection component being located on a workpiece carrier in a position which is removed from the workpiece attachment area and by positioning of a mask to a workpiece in the manner described below:

(a) Irradiation of alignment marks of a mask with exposure light, projection of the mask alignment marks onto the above described reflection component, and determination/storage of the relative positions thereof.

(b) Stopping of emission of exposure light. Subsequent movement of the workpiece carrier, on which a workpiece is placed, into a position in which the alignment marks on the mask are projected onto the above described workpiece.

(c) Irradiation of alignment marks of the workpiece with nonexposure light, determination/storage of the relative positions of the workpiece alignment marks, computation of data of the relative positions of the mask alignment marks and the workpiece alignment marks, determination of the position deviations of the two alignment marks from one another and movement of the workpiece and/or mask such that the above described two alignment marks come to rest on top of one another.

According to certain embodiments/features of the process of the present invention, positioning of the mask relative to the workpiece can be done without using a parallel flat plate and with high precision, regardless of the characteristic of the projection lens.

Furthermore, the process by which the positions of the mask alignment marks and workpiece alignment marks are determined separately, makes it possible to prevent the identification of the workpiece alignment mask from becoming difficult due to the influence of the mask alignment marks or the mask pattern and the like, and the relative positions of the two alignment marks can be easily determined. In this way, positioning can be done in a short time with high precision auto alignment.

According to other embodiments/features of the present process, by using the above described positioning step and repeat exposure, by which a reflection component is used, which is located in a position removed from the workpiece attachment area, and by which, thus, the relative positions of the mask alignment marks are determined/stored, the same effect is obtained as in the above solutions. Moreover, in this case, during exposure of each exposure zone on the workpiece, the projection images of the mask marks can be detected and the above described positions can be stored by the workpiece remaining attached to the workpiece carrier. Therefore alignment can be done with high accuracy without any effect being exerted by the accuracy of the insert positions of the alignment units.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
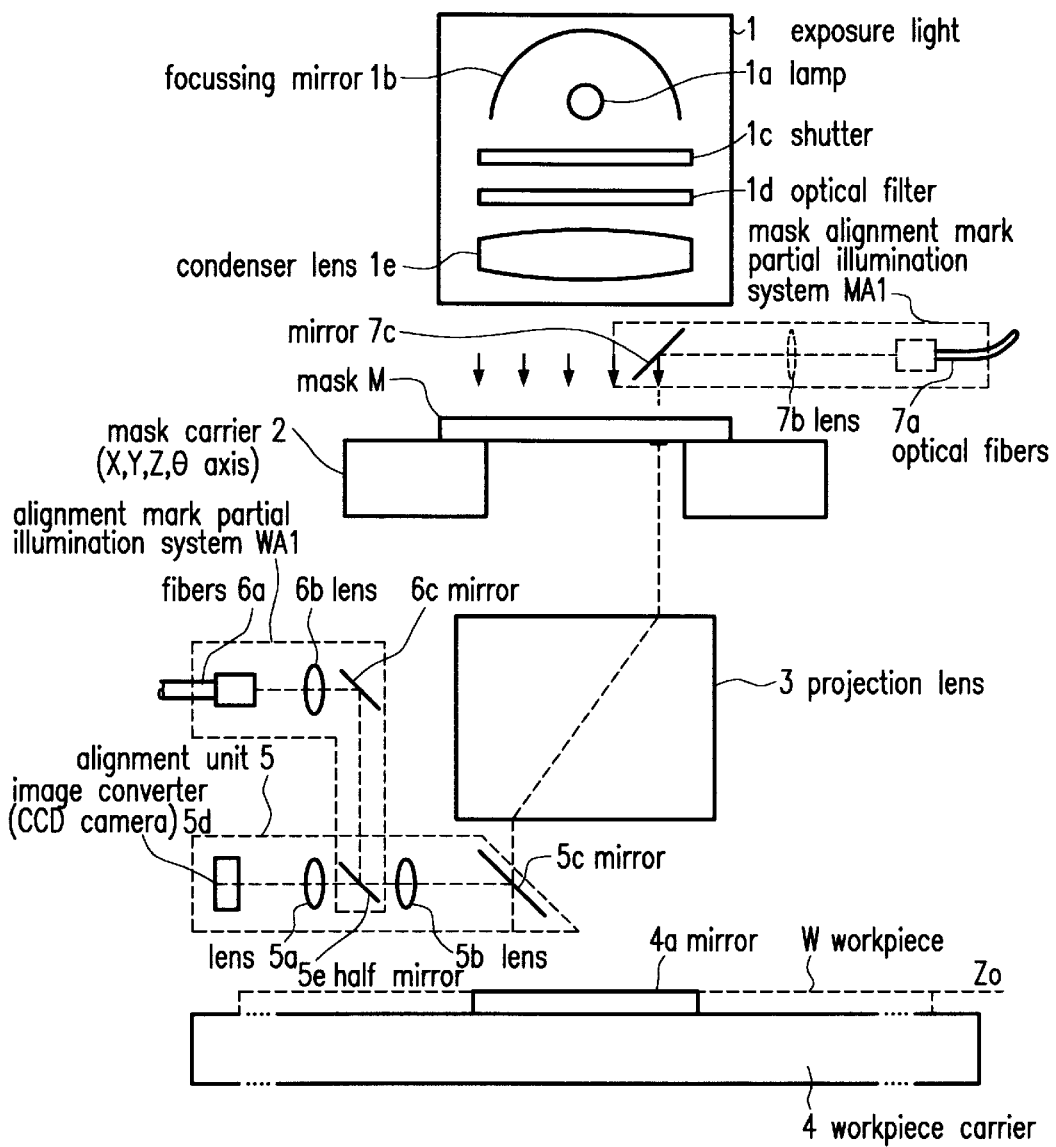
FIG. 1 shows a schematic of a first embodiment of the invention.

FIG. 1 is a schematic of a first embodiment of the invention. This embodiment relates to the execution of the above described step and repeat exposure. In the embodiment described below, step and repeat exposure is explained. However, the invention can be used not only for step and repeat exposure, but also for the exposure described above using the conventional example.

Figure 11:
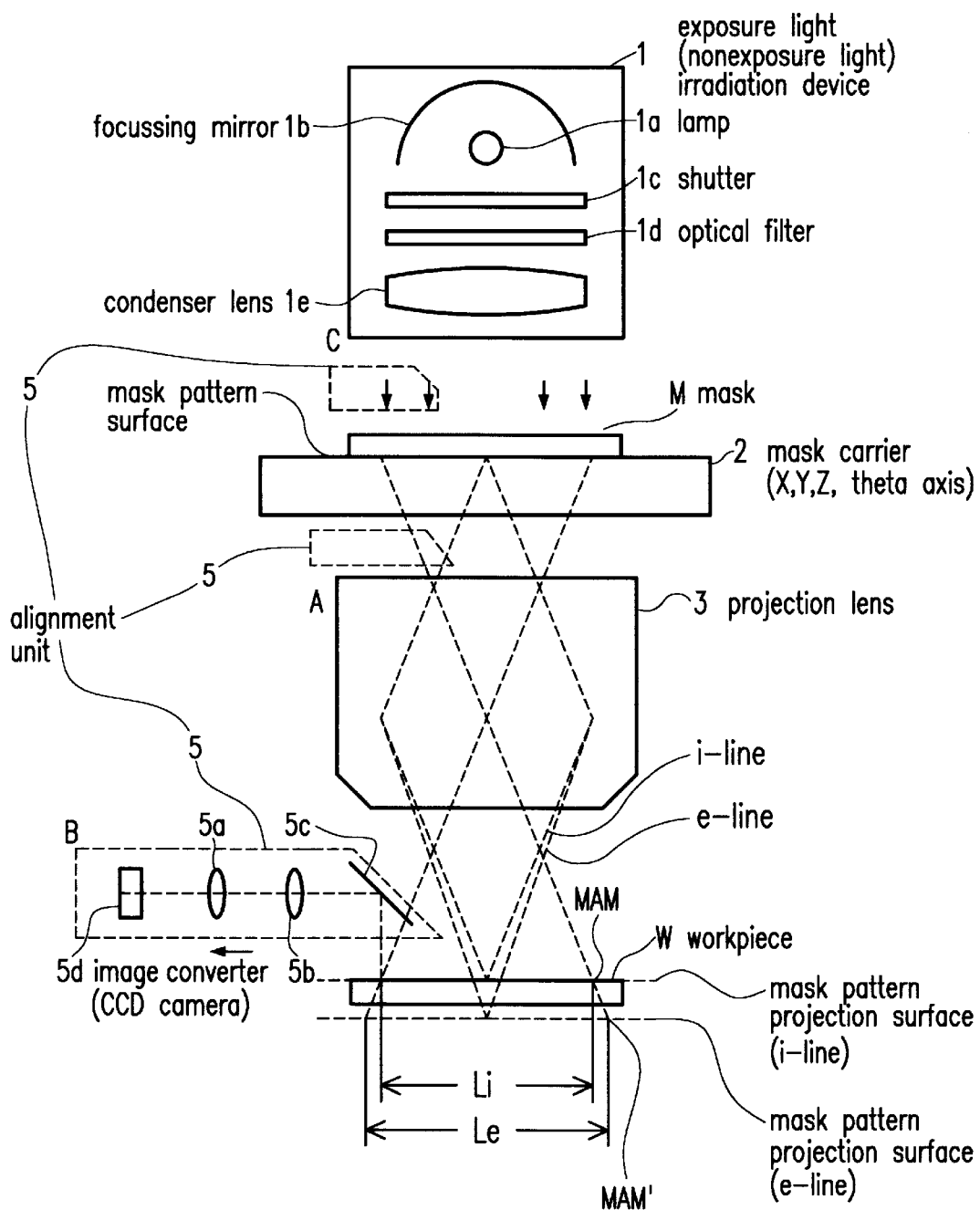
FIG. 11 shows a schematic of an arrangement of a conventional exposure device.
Figure 12:
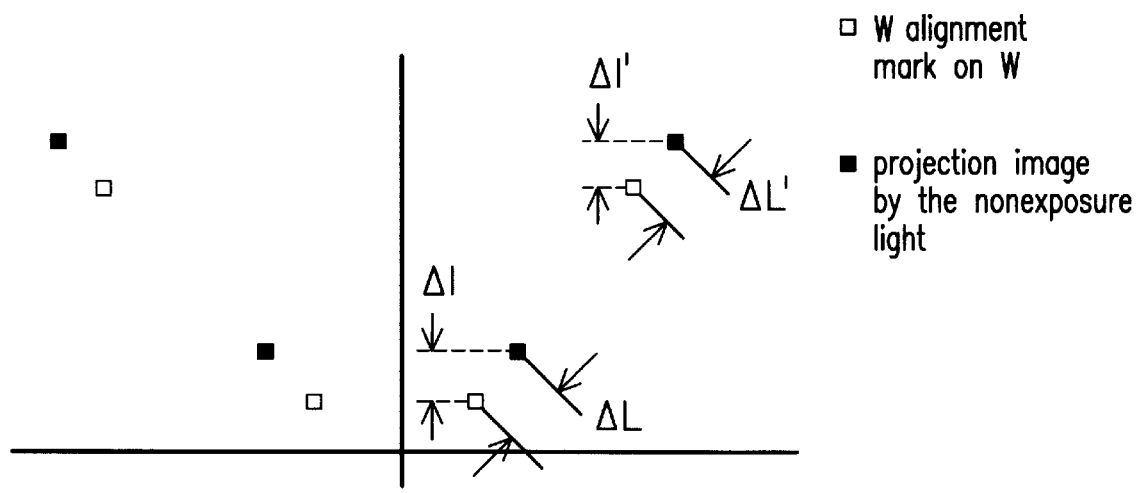
FIG. 12 shows a schematic of the positions of the alignment marks on a mask pattern projection surface.
Figure 13:
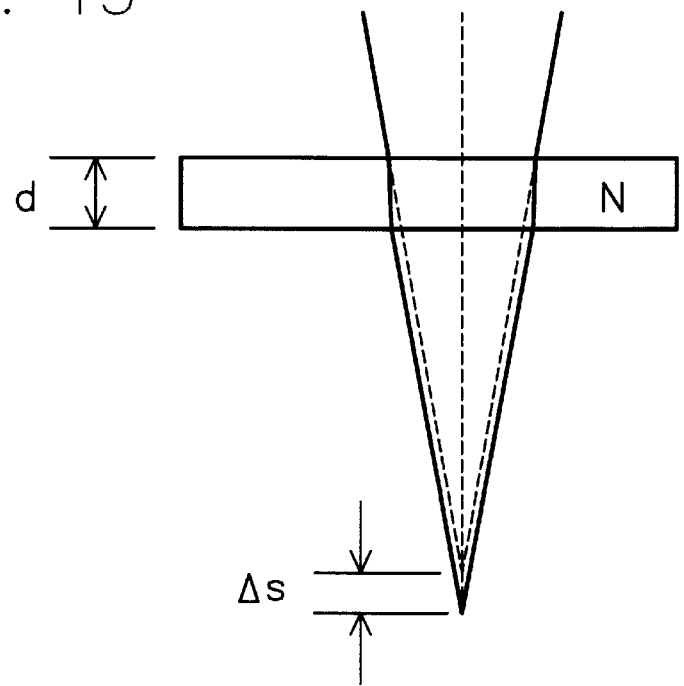
FIG. 13 shows a schematic of the deviation of the focal position by a parallel flat plate.
Figure 14:
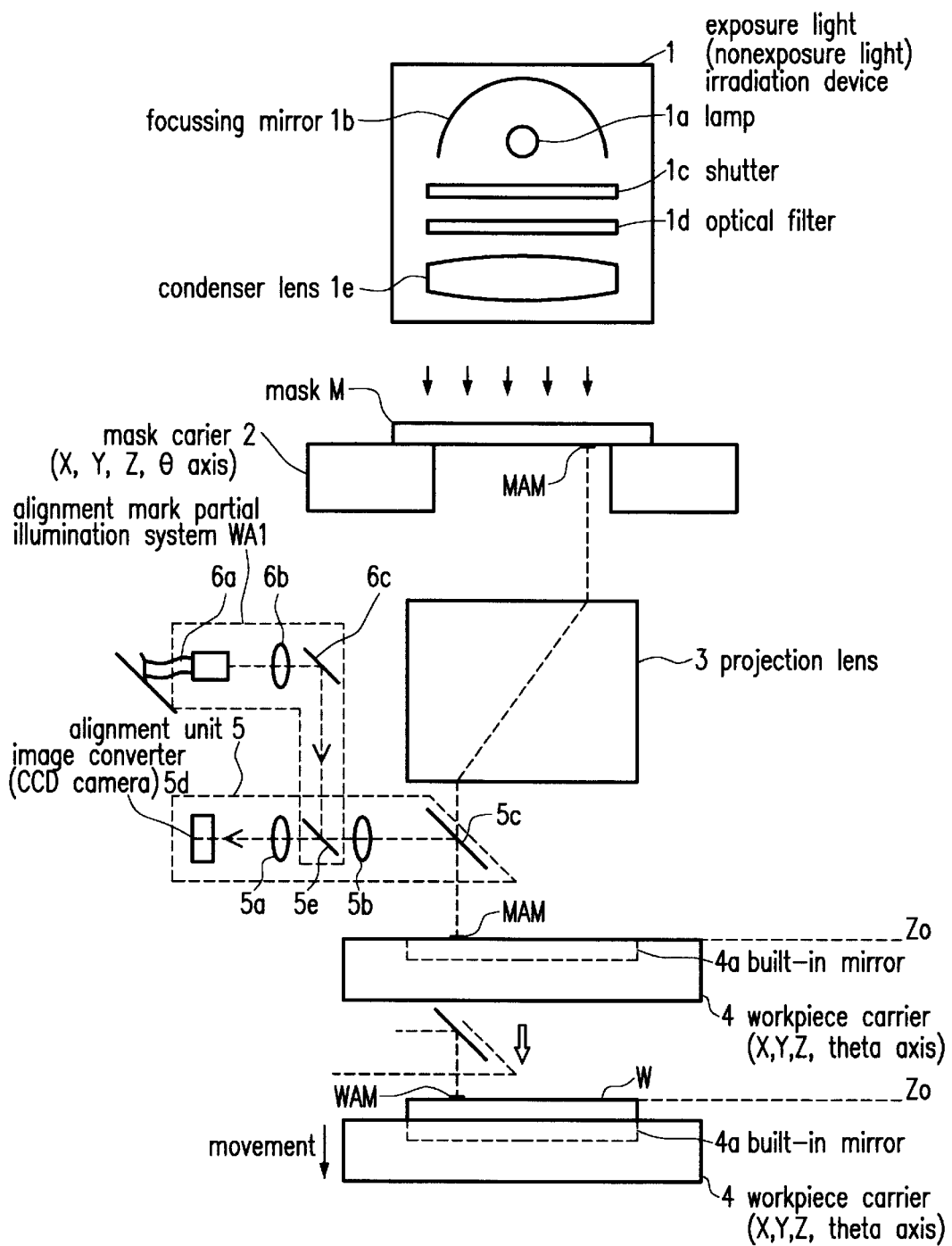
FIG. 14 shows a schematic of an arrangement of an exposure device which executes positions using a reflection component.
Figure 15:
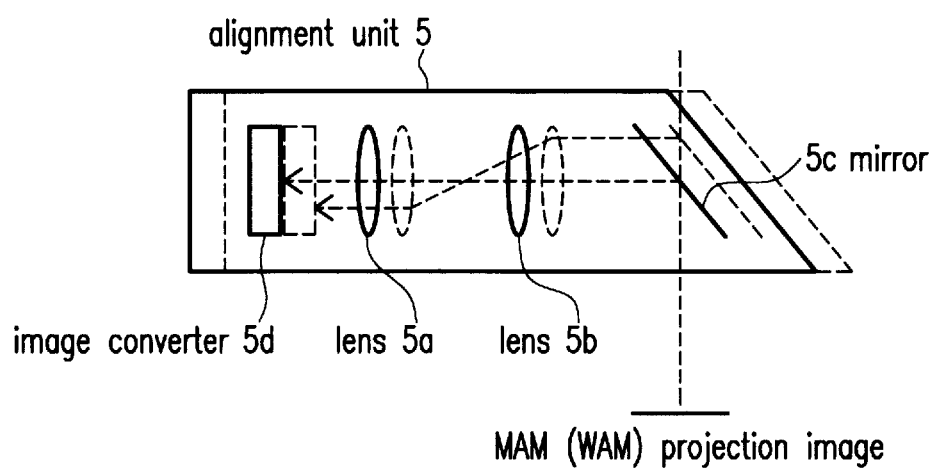
FIG. 15 shows a schematic which reproduces the relation between the stopping positions of the alignment unit and the imaging positions.

In FIG. 1, the same parts as in FIG. 11 are provided with the same reference numbers as in FIG. 11. Reference number 1 indicates the exposure light (respectively non-exposure light) irradiation device; reference number 1a, the lamp; reference number 1b, the focussing mirror; reference number 1c, the shutter; reference number 1d, the optical filter; and reference number 1e, the condenser lens. Reference number 2 indicates the mask carrier which is driven by means of a drive device (not shown in the drawing) in the X-Y-Z-θ direction. Reference letter M indicates the mask on which a mask pattern and mask alignment marks MAM are recorded for positioning purposes.

Reference symbol MA1 labels a mask alignment mark partial illumination system for irradiating mask M with exposure light. Furthermore, reference number 7a indicates optical fibers for introducing the partial illumination light; reference number 7b, a lens; and reference number 7c, a mirror.

Reference number 3 indicates the projection lens while reference letter W indicates the workpiece on which workpiece marks WAM are recorded for purposes of positioning. Reference number 4 furthermore indicates the workpiece carrier on which total reflection or half mirror 4a is installed. The workpiece carrier is driven by means of a drive device (not shown in the drawing) in the X-Y-Z-θ direction. It is desirable that mirror 4a be a half mirror as is described below.

Figure 2A:
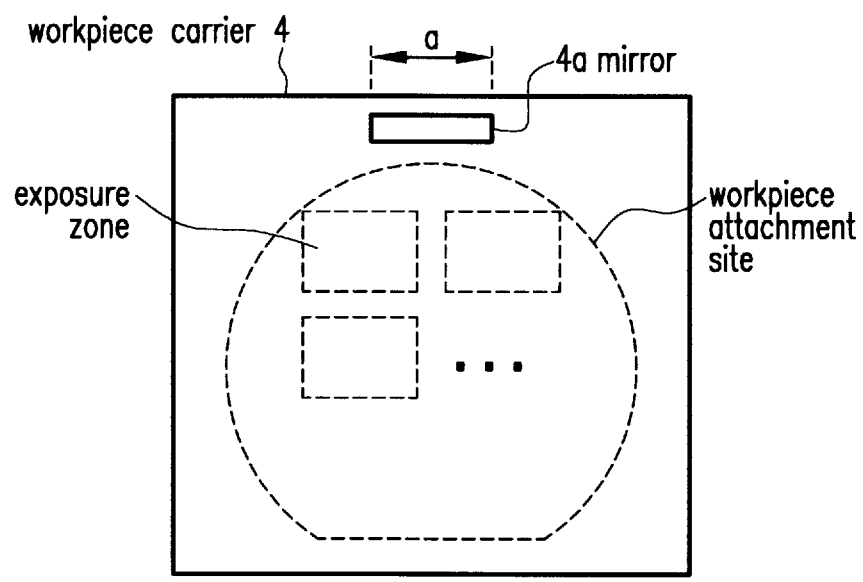
FIG. 2 shows a schematic of the arrangement of a mirror on a workpiece carrier.
Figure 2B:
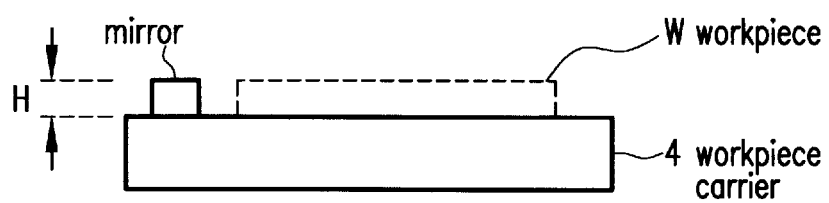

FIG. 2 (a) illustrates workpiece carrier 4 as viewed from overhead in FIG. 1. In the drawing, the site shown by the broken line designates the workpiece W attachment site. Above the workpiece attachment site, on workpiece carrier 4, is mirror 4a. On workpiece W are several exposure zones as is shown in the drawing.

Furthermore, it is desirable that the height of mirror 4a be set to the normal height H of workpiece W as is shown in FIG. 2 (b). As a result, workpiece carrier 4 can be moved in the Z-direction (vertically in FIG. 1); the amount of movement in the Z-direction when the reflection surface of mirror 4a agrees with the mask pattern projection surface can be reduced; and the accuracy can be increased, as is described above.

In FIG. 1, reference number WA1 indicates the alignment mark partial illumination system. The nonexposure light which is emitted from a light source (not shown in the drawing) is incident, via optical fibers 6a, lens 6b and mirror 6c, on half mirror 5e of alignment unit 5 and irradiates workpiece mark WAM on workpiece W. Furthermore, the nonexposure light can be emitted from exposure light (or nonexposure light) irradiation device 1 via optical filter 1d onto workpiece W without placing alignment mark partial illumination system WA1, as is described below.

Reference number 5 indicates the alignment unit which consists of lens 5a, objective lens 5b, half mirrors 5c and 5e and image converter 5d which includes the CCD camera. Mask mark MAM, which is projected onto mirror 4a located on workpiece carrier 4, and workpiece mark WAM irradiated by the above described alignment mark partial illumination system WA1, are detected via half mirror 5c, objective lens 5b, half mirror 5e, and lens 5a by means of image converter 5d.

Furthermore, as was described above, alignment unit 5 and partial illumination system WA1 are assigned according to the number of mask marks and workpiece marks, i.e., each are located at least at two sites.

Figure 3:
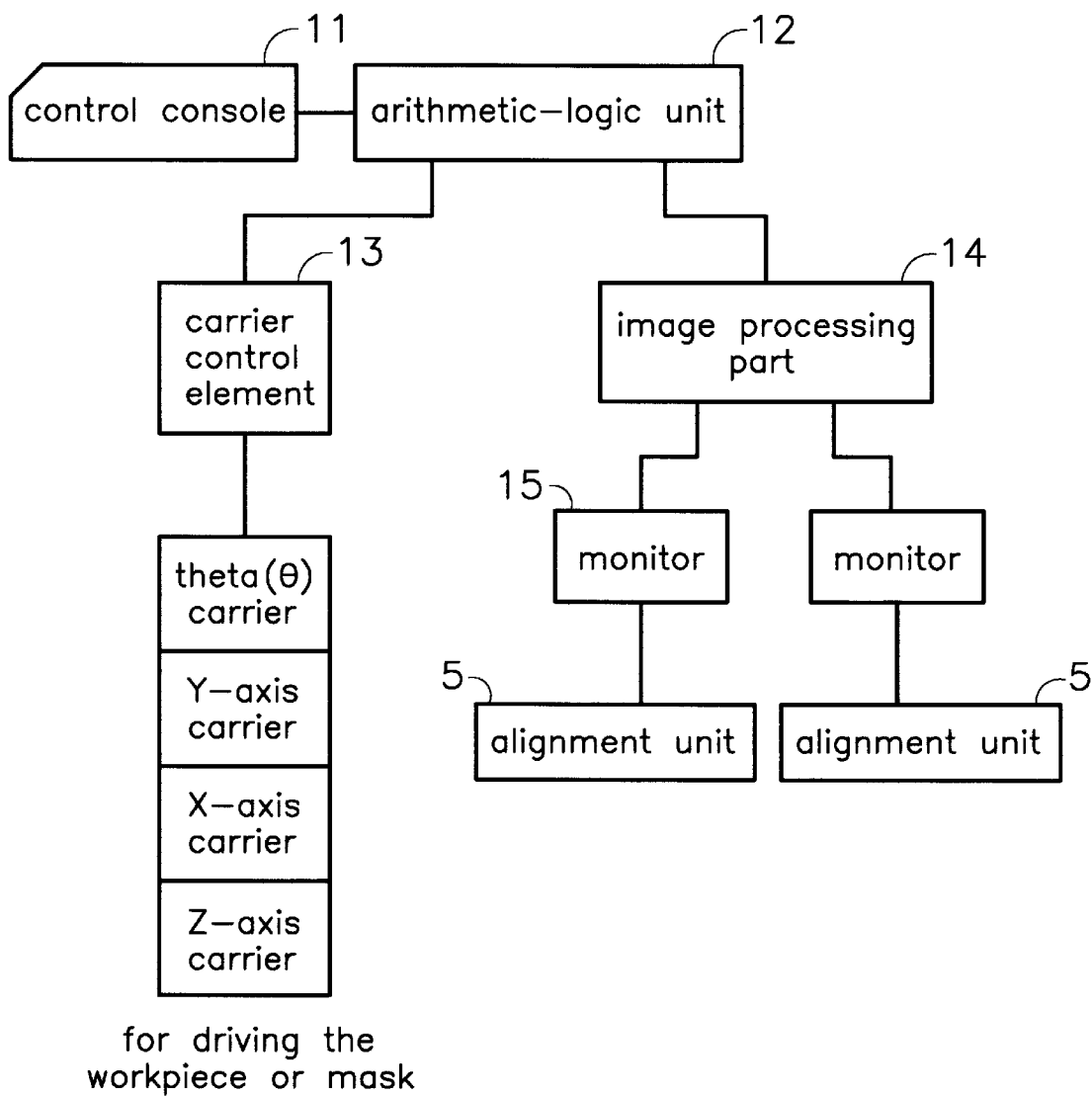
FIG. 3 shows a schematic of the arrangement of a system for control of the exposure device according to the invention.

FIG. 3 is a schematic of the arrangement of a system for controlling the exposure device according to the invention.

In the drawing, reference number 11 indicates a control console; reference number 12, an arithmetic-logic unit for control of the projection exposure device shown in FIG. 1; and reference number 13, a carrier control element which adjusts mask carrier 2 and workpiece carrier 4, which are shown in FIG. 1 in the X-Y-Z-θ directions.

Reference number 14 indicates an image processing part which recognizes mask mark MAM detected by means of image converter 5d of alignment unit 5, stores the position coordinates of the MAM, then recognizes workpiece mark WAM detected by means of image converter 5d of alignment unit 5 and determines the position coordinates of the WAM, as is described below. Furthermore, arithmetic-logic unit 12 determines the difference between the above described position coordinates of mask mark MAM and the above described position coordinates of workpiece mark WAM which have been determined in image processing part 14. Carrier control element 13 moves mask carrier 2 and/or workpiece carrier 4 such that the two agree with one another. Mask mark MAM and workpiece mark WAM, detected by alignment units 5, are displayed on monitor 15.

Figure 4:
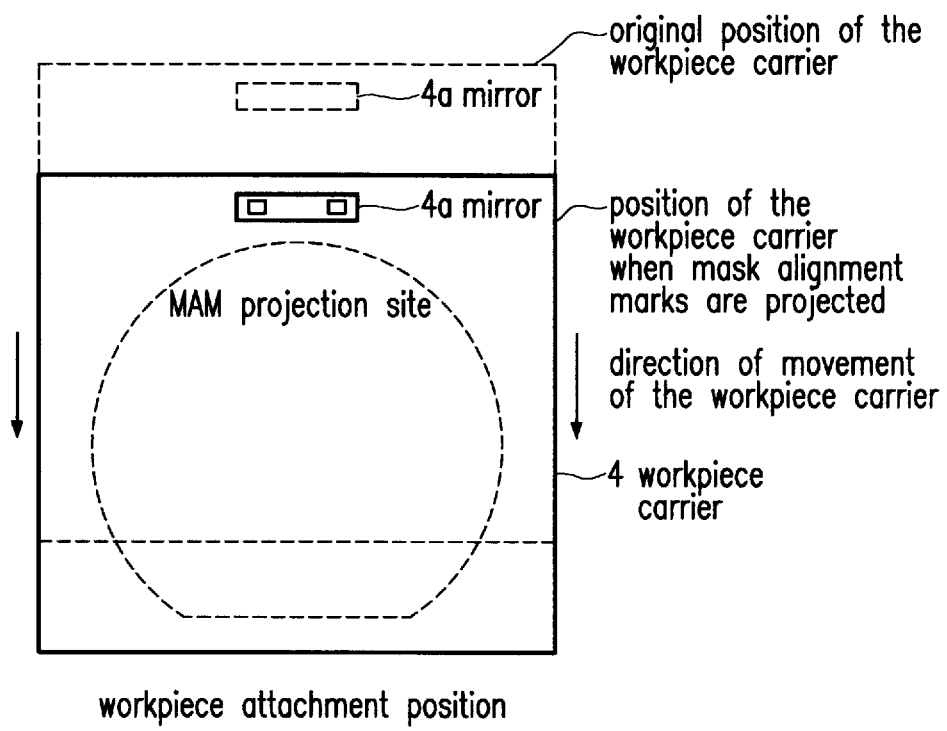
FIG. 4 shows a schematic of the position of the workpiece carrier when mask alignment marks are detected.

In the following, exposure is described for this embodiment:

(1) Mask M is placed on mask carrier 2 and attached. Mask alignment partial illumination system MA1 is inserted in a stipulated position.
(2) Workpiece carrier 4 is moved in the X-Y directions such that mirror 4a is positioned at a location onto which mask mark MAM is projected. This means that workpiece carrier 4 is moved, for example, from the site shown in FIG. 4 by the broken line as far as the site shown using the solid line, and the position of mirror 4a is brought into agreement with the projection site of mask mark MAM.
(3) Exposure light is emitted onto mask M from mask alignment partial illumination system MA1. In this process step workpiece W is not placed on workpiece carrier 4.
(4) The position of workpiece carrier 4 is shifted in the Z-direction such that the reflection surface of mirror 4a of workpiece carrier 4 agrees with mask pattern projection surface Zo caused by the exposure light.
(5) Alignment unit 5 is inserted (in the case in which alignment unit 5 was removed). Alignment mark partial illumination system WA1 is arranged integrally with alignment unit 5 and inserted together with alignment unit 5.
(6) By means of image converter 5d of alignment unit 5, mask mark MAM, projected onto mirror 4a of workpiece carrier 4, is detected and sent to image processing part 14. Image processing part 14 identifies mask mark MAM based on the detected image and stores the position coordinates thereof (XM, YM).

The projection image of mask mark MAM conventionally has a greater contrast compared to workpiece mark WAM. When a total reflection mirror is used for the above described mirror 4a, there are cases in which the difference between the detected image of mask mark MAM and the detected image of workpiece mark WAM becomes great, and in which difficulties occur with respect to recognition of the alignment mark. It is therefore desirable to use a half mirror for above described mirror 4a and make the contrast the same as for workpiece mark WAM.

(7) Emission of exposure light from mask alignment partial illumination system MA1 is stopped.
(8) Workpiece W is placed on workpiece carrier 4 and attached in the position shown in FIG. 2.
(9) Workpiece carrier 4 is moved in the Z-direction such that the surface of workpiece W agrees with mask pattern projection surface Zo.
(10) Workpiece carrier 4 is moved in the X-Y directions such that workpiece mark WAM agrees with the projection site of mask mark MAM. Thus, rough adjustment of the position of workpiece W is effected.

Figure 5:
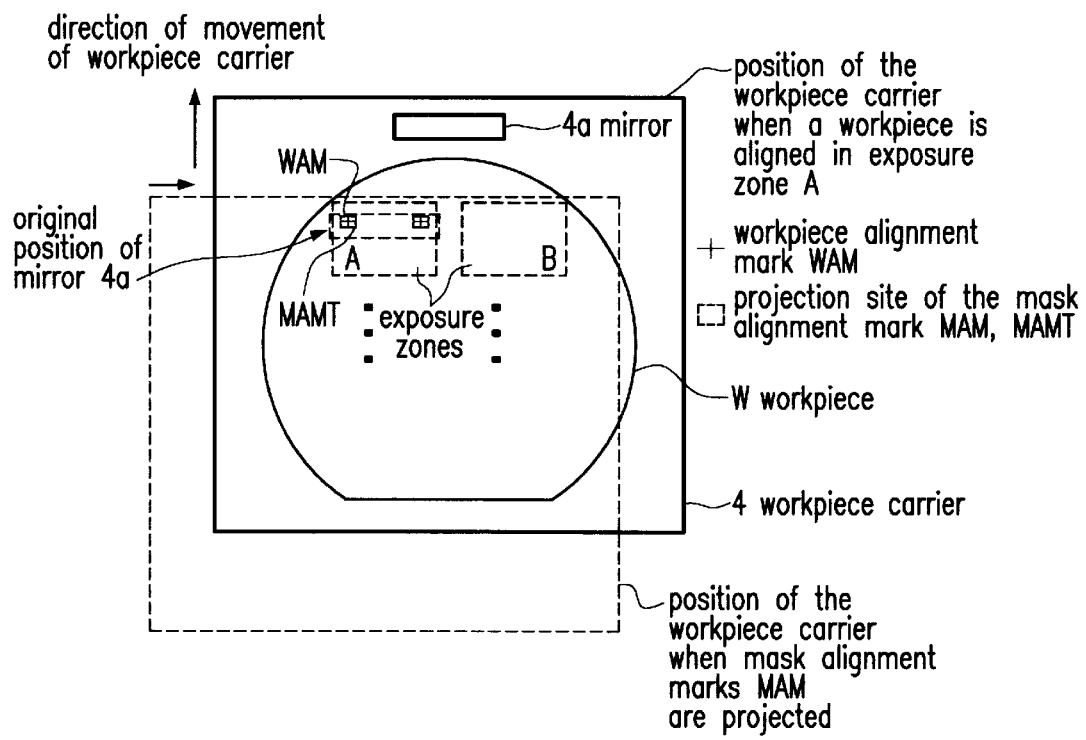
FIG. 5 shows a schematic of the position of the workpiece carrier when workpiece alignment marks are detected.

This means that workpiece carrier 4 is moved, for example, from the position shown by the broken line to the position shown by the solid line, as shown in FIG. 5. The position of workpiece mark WAM of the exposure zone as the article to be exposed on workpiece W, is brought essentially into agreement with projection site MAMT of mask mark MAM so that workpiece mark WAM extends into the visual field of alignment unit 5.

(11) The illumination light is introduced into alignment mark partial illumination system WA1 as nonexposure light. This means that a shutter of a light source (not shown in the drawing) is opened for purposes of partial illumination and workpiece mark WAM on workpiece W is irradiated via optical fibers 6a, lens 6b, mirror 6c, half mirror 5e, lens 5b, and half mirror 5c.
(12) Workpiece mark WAM is recorded by means of image converter 5d. The image of workpiece mark WAM detected by image converter 5d is sent to image processing part 14 which identifies workpiece mark WAM and determines its position coordinates (XW, YW).
(13) Emission of nonexposure light from alignment mark partial illumination system WA1 is stopped.
(14) Arithmetic-logic unit 12 determines the position deviation of workpiece W and mask M based on stored position coordinates (XM, YM) of mask mark MAM and determined position coordinates (XW, YW) of the workpiece mark WAM; the amount of the position deviations of workpiece carrier 4 being considered in above described steps (2) and (10).

This means that the amount of position deviation of workpiece carrier 4 in above described steps (2) and (10) is known from values of an encoder count or the like, which is located in a workpiece carrier movement device (not shown in the drawing). The value of above described position coordinates (XW, YW) is corrected according to the value of the difference of ΔX, ΔY between the position of workpiece carrier 4 in step (2) and the position of workpiece carrier 4 in step (10). Thus, the position deviation between corrected position coordinates (XM+ΔX, YM+ΔY) and above described position coordinates (XW, YW) is determined.

(15) Carrier control element 13, due to the above described position deviation, drives mask carrier 2 and/or workpiece carrier 4 in the X-Y-θ directions and brings the position of mask mark MAM into agreement with the position of workpiece mark WAM.
(16) Alignment unit 5 and mask alignment partial illumination system MA1 are removed.
(17) Shutter 1c of exposure light irradiation device 1 is opened. The exposure light is emitted onto mask M in the state in which optical filter 1d is removed from the optical path and thus exposure is effected. After completion of exposure, shutter 1c is closed.
(18) Workpiece carrier 4 is moved a certain amount such that the next exposure zone is positioned in a stipulated exposure position.
(19) Mask alignment partial illumination system MA1 is inserted in a stipulated position.
(20) As in above described step (2), workpiece carrier 4 is moved in the X-Y directions such that mirror 4a is positioned in the projection site of mask mark MAM.
(21) Exposure light is emitted onto mask M by mask alignment partial illumination system MA1.
(22) The position of workpiece carrier 4 is shifted in the Z-direction such that the reflection surface of mirror 4a of workpiece carrier 4 agrees with mask pattern projection surface Zo by the exposure light.

(23) Alignment unit 5 is inserted.

Subsequently, there is a return to above described process (6), processes (6) through (23) are repeated, and the respective exposure zone of workpiece W is exposed.

As was described above, in this embodiment, workpiece mark WAM can be irradiated by nonexposure light and the position coordinates of workpiece mark WAM can be determined, and positioning of the mask to the workpiece can be done without using the parallel flat plate, regardless of the characteristic of the projection lens, and with high precision. These advantages are achieved by the present process wherein mirror 4*a* is positioned on workpiece carrier 4, by which 1) workpiece carrier 4 is moved in the X-Y directions such that mirror 4*a* is positioned in the projection site of mask mark MAM; 2) the reflection surface of mirror 4*a* is brought into agreement with mask pattern projection surface Zo, by which, by emission of exposure light, mask mark MAM is projected onto mirror 4*a* and the position coordinates of mask mark MAM are stored; 3) then emission of the above described exposure light is stopped; 4) workpiece carrier 4 is moved such that the position of workpiece mark WAM in the exposure zone as the article to be exposed on workpiece W, is brought essentially into agreement with the projection site of mask mark MAM, and by which 5) the surface of workpiece W is brought into agreement with the mask pattern projection surface.

Furthermore, by locating mirror 4*a* at a site which differs from the workpiece location on workpiece carrier 4, in each exposure of the respective exposure zone on workpiece W, the projection image of mask mark MAM can be detected and its position stored, while workpiece W remains attached on workpiece carrier 4. Therefore, in the above described position, the two alignment marks can be detected, even if the insertion position of alignment unit 5 differs upon each exposure. In this way, a reduction of alignment accuracy can be prevented.

Furthermore, the process by which the positions of mask marks MAM and the positions of workpiece marks WAM are determined separately, prevents the identification of the workpiece marks from becoming difficult due to the influence of mask marks MAM or the mask pattern or the like. In this way, the relative positions of the mask marks and the workpiece marks can be easily determined and therefore positioning can be done with high precision within a short time by auto alignment.

Figure 6:
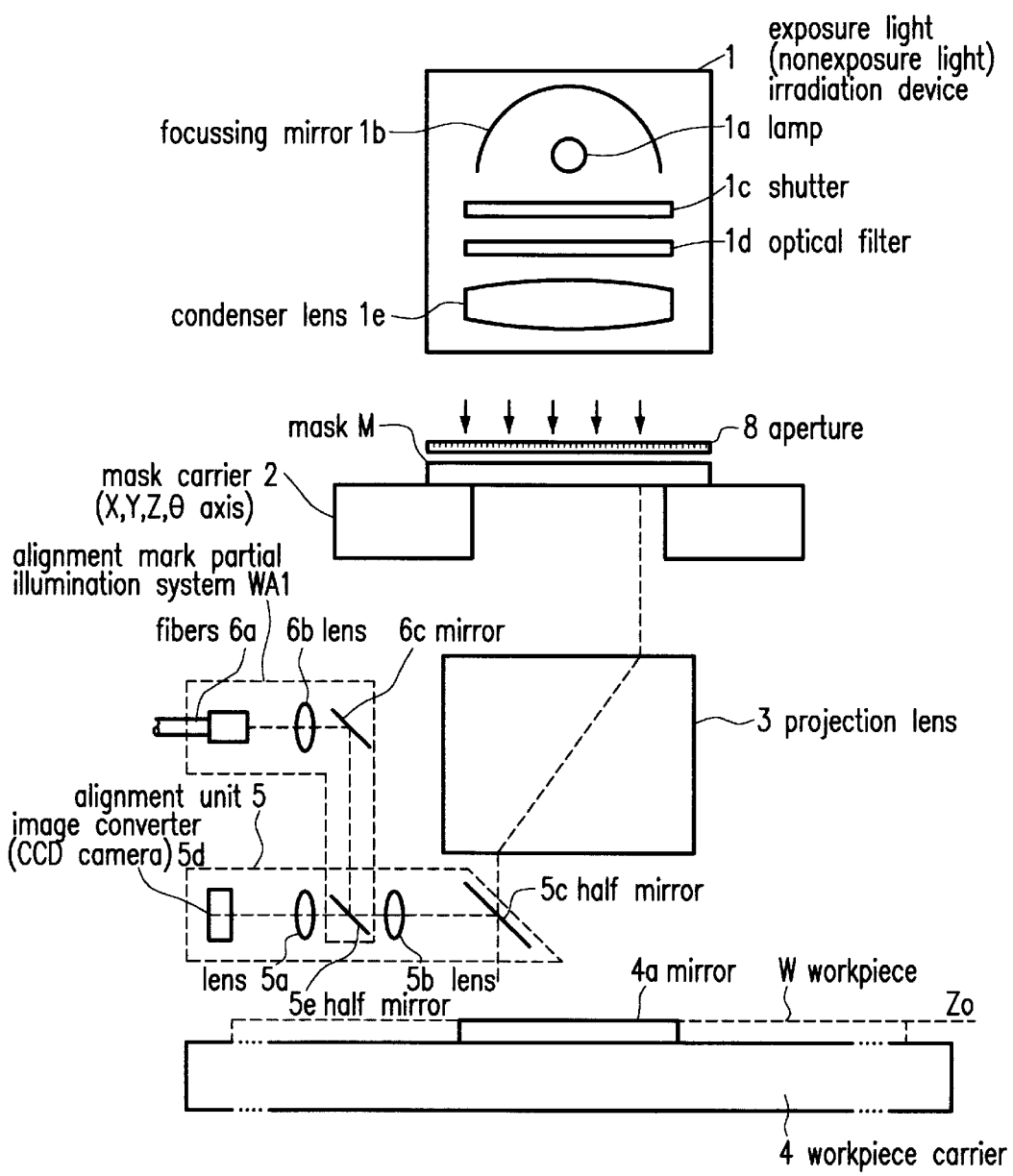
FIG. 6 shows a schematic of a second embodiment of the invention.

FIG. 6 is a schematic of a second embodiment of the invention. In FIG. 6, the same parts as in FIG. 1 are provided with the same reference numbers as in FIG. 1. In this embodiment, instead of the arrangement of mask alignment partial illumination system MA1 in FIG. 1, there is aperture 8 which is inserted and removed on mask M. When the mask is aligned, exposure light is emitted from openings of the aperture onto the mask. Other arrangements are identical to the embodiment in FIG. 1.

Figure 7:
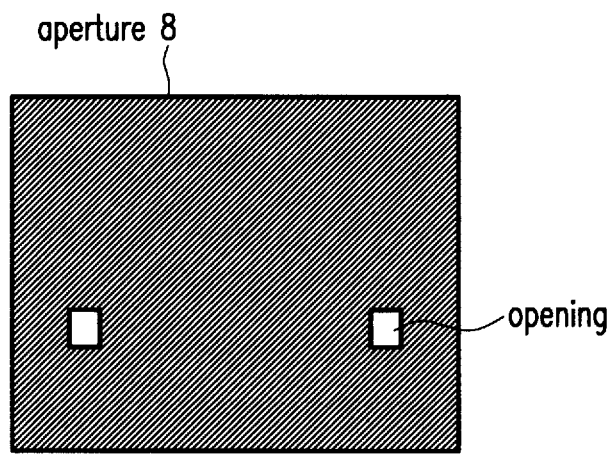
FIG. 7 shows a schematic of an aperture which is used for the second embodiment.

FIG. 7 is a view in which above described aperture 8 is viewed from overhead in FIG. 6. As is shown in FIG. 7, in aperture 8, there are openings which correspond to the sites provided with mask marks MAM.

In the following, exposure is described according to this embodiment.

(1) Mask M is placed on mask carrier 2 and attached.

(2) Aperture 8 is inserted in a stipulated position on mask M, as shown in FIG. 6. The openings of aperture 8 are essentially positioned directly above mask mark MAM.

(3) As discussed above in relation to FIG. 4, workpiece carrier 4 is moved in the X-Y directions such that mirror 4*a* is positioned in the position site of mask mark MAM so that the position of mirror 4*a* agrees with the projection site of mask mark MAM.

(4) Shutter 1*c* of exposure light (or nonexposure) irradiation device 1 is opened in the state in which optical filter 1*d* is removed from the optical path, and the exposure light is emitted onto mask M. In this process, step workpiece W is not placed on workpiece carrier 4.

(5) The position of workpiece carrier 4 is shifted in the Z-direction such that the reflection surface of mirror 4*a* of workpiece carrier 4 agrees with mask pattern projection surface Zo by the exposure light.

(6) Alignment unit 5 is inserted.

(7) Mask mark MAM projected onto mirror 4*a* of workpiece carrier 4 is detected by means of image converter 5*d* of alignment unit 5 and its position coordinates (XM, YM) are stored.

(8) Shutter 1*c* of exposure light (or nonexposure) irradiation device 1 is closed. Emission of exposure light is stopped.

(9) Workpiece W is placed on workpiece carrier 4 and attached.

(10) Workpiece carrier 4 is moved in the Z-direction such that the surface of workpiece W agrees with mask pattern projection surface Zo.

(11) Workpiece carrier 4 is moved in the X-Y directions such that workpiece mark WAM agrees with projection site MAMT of mask mark MAM, as illustrated in FIG. 5. Thus rough adjustment of the position of workpiece W is effected.

(12) Exposure light is introduced into alignment mark partial illumination system WA1 as nonexposure light. The nonexposure light is emitted onto workpiece mark MAM on workpiece W.

(13) Workpiece mark WAM is detected by means of image converter 5*d* and its position coordinates (XW, YW) are determined.

(14) Emission of nonexposure light from alignment mark partial illumination system WA1 is stopped.

(15) The position deviation of workpiece W from mask M is determined on the basis of position coordinates (XM, YM) of mask mark MAM and position coordinates (XW, YW) of workpiece mark WAM; the amount of the position deviations of workpiece carrier 4 being considered in above described steps (3) and (11).

As in the first embodiment, the amount of position deviation of workpiece carrier 4 in above described steps (3) and (11) is known from the values of an encoder count or the like, which is located in a workpiece carrier movement device which is not shown in the drawing.

(16) Mask carrier (2) and/or workpiece carrier 4 is/are driven in the X-Y-θ directions and the position of mask mark MAM is brought into agreement with the position of workpiece mark WAM.

(17) Alignment unit 5 and aperture 8 are removed.

(18) Shutter 1*c* of exposure light irradiation device 1 is opened, exposure light is emitted onto mask M, and thus exposure is effected. After completion of exposure, shutter 1*c* is closed.

(19) Workpiece carrier 4 is moved a certain amount such that the next exposure zone is positioned in a stipulated exposure position.

(20) Aperture 8 is inserted in a stipulated position on mask M.

(21) As in above described process (3), workpiece carrier 4 is moved in the X-Y directions such that mirror 4*a* is positioned in the projection site of mask mark MAM.

(22) Exposure light is emitted onto mask M.

(23) The position of workpiece carrier 4 is shifted in the Z-direction such that the reflection surface of mirror 4*a* of workpiece carrier 4 agrees with mask pattern projection surface Zo by the exposure light.

(24) Alignment unit 5 is inserted.

Subsequently, there is a return to above described process (7), processes (7) through (24) are repeated, and the respective exposure zone of workpiece W is exposed.

As was described above, in this embodiment, a simpler arrangement of the device can be achieved with lower costs compared to the first embodiment as a result of the aperture being used instead of the mask alignment partial illumination system.

Furthermore, it is desirable in this embodiment that the size of workpiece carrier 4 and its amount of movement in the X-Y directions is greater than in the first embodiment, and that the distance between the workpiece arrangement site and mirror 4a is greater than in the first embodiment. In this way, when the mask is aligned, it is possible to prevent workpiece W from being exposed by the exposure light which emerges from the openings of aperture 8.

Figure 8:
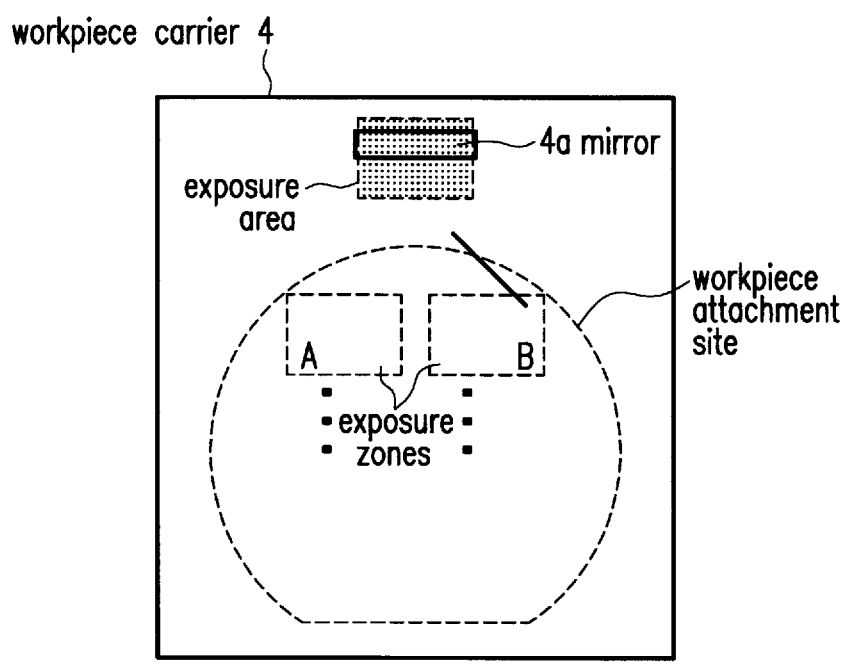
FIG. 8 shows a schematic of the workpiece carrier according to a third embodiment of the invention.

FIG. 8 is a schematic of workpiece carrier 4 according to a third embodiment of the invention in which workpiece carrier 4 is viewed from overhead. In this embodiment, mirror 4a is located in a position which is completely removed from the workpiece arrangement site on workpiece carrier 4, as is shown in the drawing. This prevents exposure light from being emitted onto workpiece W when exposure light is emitted onto mask M in mask alignment from exposure light (or nonexposure light) irradiation device 1.

The exposure process of this embodiment will now be described. In the exposure device in this embodiment, mask alignment partial illumination system MA1 is removed from the parts in FIG. 1, or aperture 8 is removed from the parts in FIG. 6. Furthermore, in this case, the size/arrangement of the mirror on workpiece carrier 4 is changed and the amount of movement of workpiece carrier 4 in the X-Y directions is increased, while other arrangements are identical to the arrangements in FIGS. 1 and 6.

(1) Mask M is placed on mask carrier 2 and attached.

Figure 9:
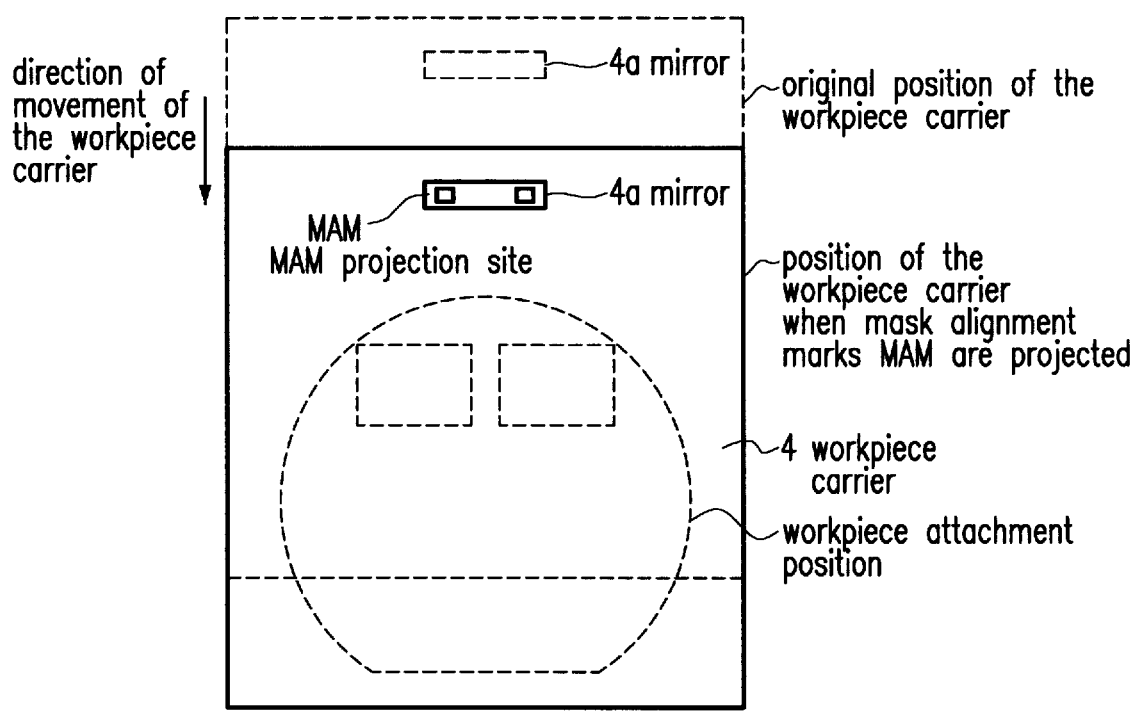
FIG. 9 shows a schematic of the position of the workpiece carrier when the mask alignment marks are detected.

(2) As is shown in FIG. 9, workpiece carrier 4 is moved in the X-Y directions such that mirror 4a is positioned in the projection site of mask mark MAM so that the position of mirror 4a agrees with the projection site of mask mark MAM.

(3) Shutter 1c of exposure light (or nonexposure) irradiation device 1 is opened in the state in which optical filter 1d is removed from the optical path, and the exposure light is emitted onto mask M. In this process step, workpiece W is not placed on workpiece carrier 4.

(4) The position of workpiece carrier 4 is shifted in the Z-direction such that the reflection surface of mirror 4a of workpiece carrier 4 agrees with the mask pattern projection surface Zo by the exposure light.

(5) Alignment unit 5 is inserted.

(6) Mask mark MAM projected onto mirror 4a of workpiece carrier 4 is detected by means of image converter 5d of alignment unit 5 and its position coordinates (XM, YM) are stored.

(7) Shutter 1c of exposure light (or nonexposure) irradiation device 1 is closed. Emission of exposure light is stopped.

(8) Workpiece W is placed on workpiece carrier 4 and attached.

(9) Workpiece carrier 4 is moved in the Z-direction such that the surface of workpiece W agrees with mask pattern projection surface Zo.

Figure 10:
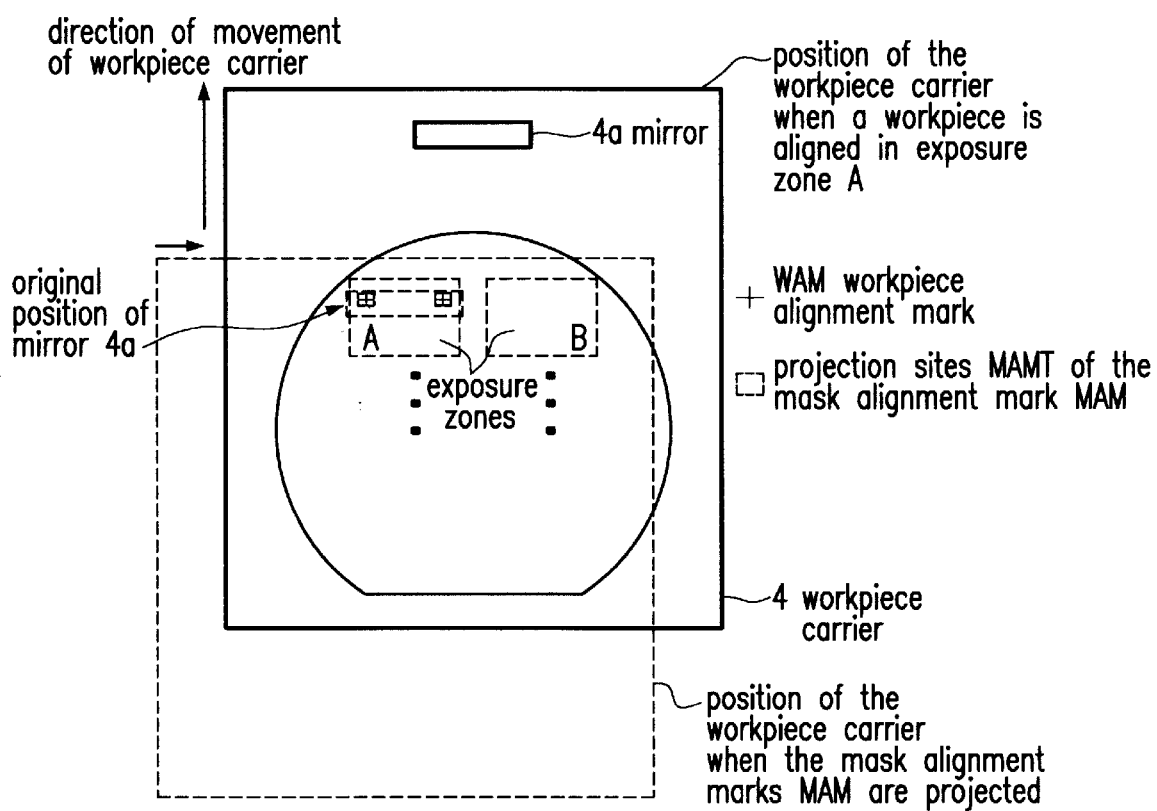
FIG. 10 shows a schematic of the position of the workpiece carrier when the workpiece alignment marks are detected.

(10) Workpiece carrier 4 is moved in the X-Y directions such that workpiece mark WAM agrees with projection site MAMT of mask mark MAM, as illustrated in FIG. 10. Thus rough adjustment of the position of workpiece W is effected.

(11) Illumination light as nonexposure light is introduced into alignment mark partial illumination system WA1. The nonexposure light is emitted onto workpiece mark WAM on workpiece W.

(12) Workpiece mark WAM is detected by means of image converter 5d and its position coordinates (XW, YW) are determined.

(13) Emission of nonexposure light from alignment mark partial illumination system WA1 is stopped.

(14) The position deviation of workpiece W from mask M is determined on the basis of position coordinates (XM, YM) of mask mark MAM and determined position coordinates (XW, YW) of workpiece mark WAM; the amount of the position deviations of workpiece carrier 4 being considered in above described steps (2) and (10).

As in the first embodiment, the amount of position deviation of workpiece carrier 4 in above described steps (2) and (10) is known from the values of an encoder count or the like, which is located in a workpiece carrier movement device which is not shown in the drawing.

(15) Mask carrier 2 and/or workpiece carrier 4 is/are driven in the X-Y-θ directions and the position of mask mark MAM is brought into agreement with the position of workpiece mark WAM.

(16) Alignment unit 5 is removed.

(17) Shutter 1c of exposure light irradiation device 1 is opened, exposure light is emitted onto mask M, and thus exposure is effected. After completion of exposure, shutter 1c is closed.

(18) Workpiece carrier 4 is moved a certain amount such that the next exposure zone is positioned in a stipulated exposure position.

(19) As in above described process (2), workpiece carrier 4 is moved in the X-Y directions such that mirror 4a is positioned in the projection site of mask mark MAM.

(20) Exposure light is emitted onto mask M.

(21) The position of workpiece carrier 4 is shifted in the Z-direction such that the reflection surface of mirror 4a of workpiece carrier 4 agrees with mask pattern projection surface Zo by the exposure light.

(22) Alignment unit 5 is inserted.

Subsequently, there is a return to above described process step (6), process steps (6) through (22) are repeated and the respective exposure zone of workpiece W is exposed.

In this embodiment, by the measure by which mirror 4a is located in a position which is completely removed from the workpiece arrangement site on workpiece carrier 4, without using the mask alignment partial illumination system in FIG. 1 or the aperture 8 in FIG. 6 during mask alignment, the exposure light can be emitted from exposure light (or nonexposure light) irradiation device 1, as was described above.

Furthermore, the emission of nonexposure light in the respective embodiment can be done via optical filter 1d from exposure light (or nonexposure light) irradiation device 1, instead of using alignment mark partial illumination system WA1.

Furthermore, in all embodiments, it is desirable that, in the case in which the positions of mask marks MAM and the positions of workpiece mark WAM are brought into agreement with one another, only the workpiece carrier be driven in the X-Y-θ directions. The reason for this lies in the following:

Generally, both the mask carrier and the workpiece carrier have certain inaccuracies in the amount of their movement. It is therefore necessary, after moving the carrier in the stipulated amount for purposes of positioning, to again confirm the position ratio between mask mark MAM and workpiece marks WAM and to repeat positioning if the amount of position deviation is not less than or equal to an allowable value.

In the case in which only the workpiece carrier is driven, it is possible that nonexposure light is emitted again onto workpiece mark WAM and their position coordinates (XW, YW) stored and then compared to position coordinates (XM, YM) of the mask marks which were previously stored.

On the other hand, in the case in which the mask carrier is driven, it is necessary that the exposure light is emitted onto mask marks MAM and that the positions of position coordinates (XM, YM) of its projection images are stored. In this case of repeated positioning, however, the above described projection image must be projected onto the workpiece with the resist on the workpiece being exposed to the action of exposure light.

In the case of driving the mask carrier, it is therefore necessary, using a length measuring means such as an extra laser interferometer, or the like, to measure the amount of movement of the mask carrier, and based on this data, to execute readjustment, or to use a carrier with high accuracy of movement as the mask carrier. Ordinarily positioning is frequently accomplished only by driving the workpiece carrier.

ACTION OF THE INVENTION

As was described above, the following effects can be obtained by the process of the present invention by which, on the workpiece carrier in one position, there is a reflection component which is removed from the workpiece attachment site; by which the mask alignment marks are projected onto the reflection component; by which their relative positions are determined/stored; by which then the workpiece carrier provided with the workpiece is moved into a position in which the alignment marks on the mask are projected onto the above described workpiece; by which the nonexposure light is emitted onto the alignment marks of the workpiece; by which the relative positions of the workpiece alignment marks are determined/stored; by which the data of the relative positions of the mask alignment marks and the workpiece alignment marks are computed; and by which the workpiece and/or the mask is/are moved such that the two alignment marks come to rest on top of one another.

(1) Positioning of the mask relative to the workpiece can be done with high precision and without using the parallel flat plate, regardless of the characteristic of the projection lens.

Furthermore, by separately determining the positions of the mask marks MAM and workpiece marks WAM, the present process permits the relative positions of the mask marks and workpiece marks to be easily determined without identification of the workpiece alignment mask becoming difficult by the influence of mask marks MAM or by the mask pattern and the like. Therefore, positioning can be done in a short time with high precision by auto alignment.

(2) By using the invention for step and repeat exposure and by determining/storing the relative positions of the alignment marks of the mask using the reflection component, which is located in the position removed from the workpiece attachment site, in the exposure of the respective exposure zone on the workpiece, the projection images of the mask marks can be detected and their positions stored, while the workpiece remains attached on the workpiece carrier. Therefore, alignment can be done with high precision without any influence being exerted by the accuracy of the insert positions of the alignment units.

It is to be understood that although preferred embodiments of the invention have been described, various other embodiments and variations may occur to those skilled in the art. Any such other embodiments and variations which fall within the scope and spirit of the present invention are intended to be covered by the following claims.

We claim:

1. Process for positioning a mask relative to a work piece, comprising the steps:

emitting exposure light from a first light irradiation device onto alignment marks of the mask;

projecting the alignment marks of the mask onto a reflection component located on a workpiece carrier in a position at a projection site removed from a workpiece attachment site using said exposure light;

detecting said projection images and subjecting said projection images to image processing;

determining and storing relative positions of said projection images;

stopping emission of the exposure light from the first light irradiation device;

moving the workpiece carrier on which the workpiece is positioned into a position at the projection site in which the alignment marks on the mask are projected onto the workpiece instead of the reflection component;

emitting non-exposure light to said projection site from one of the first light irradiation device and a second light irradiation device onto alignment marks of the workpiece;

detecting the alignment marks of the workpiece using said non-exposure light and subjecting the alignment marks of the workpiece to image processing;

determining and storing the relative positions of the alignment marks of the workpiece;

computing data of the relative positions of the alignment marks of the mask and the workpiece;

moving at least one of the workpiece and the mask such that the alignment marks of the mask and the workpiece come to rest on top of one another.

2. A device for positioning a mask having alignment marks relative to a workpiece having alignment marks and a plurality of exposure zones, using step and repeat exposure, comprising:

a workpiece carrier on which the workpiece is positioned;

a control means for controllably moving at least one of the mask and the workpiece carrier, said control means moving said workpiece carrier by a stipulated amount during each movement;

a first light irradiation device for emitting light toward the mask, wherein a respective exposure zone on the workpiece is moved in steps to an exposure zone in which said first light irradiation device emits exposure light onto the mask, and the respective exposure zone on the workpiece is exposed in steps;

a reflection component positioned on the workpiece carrier in a position removed from a workpiece attachment site, wherein, when the mask alignment marks are irradiated with exposure light, the workpiece carrier is moved into a position in which the mask alignment marks are projected onto the reflection component to form projection images and the workpiece is positioned outside of an optical path of said exposure light;

an image detecting means for detecting said projection images;

an image processing means for determining and storing relative positions of the projection images, wherein when emission of the exposure light from the first light irradiation device is stopped, the workpiece carrier is moved to a projection position at which images of the mask alignment marks are projected onto the workpiece instead of the reflection component, and wherein one of the first light irradiation device and a second light irradiation device emits non-exposure light onto the alignment marks of the workpiece, said image detecting means detecting the workpiece alignment marks and said image processing means determining and storing the relative positions of the workpiece alignment marks and computing data corresponding to the relative positions of the workpiece and mask alignment marks, wherein said control means moves at least one of the workpiece and the mask such that the workpiece and mask alignment marks come to rest on top of one another.

3. A device for positioning a mask relative to a workpiece having alignment marks, comprising:

a mask including alignment marks;

a mask carrier for supporting the mask;

a projection lens;

a workpiece carrier for supporting the workpiece, the workpiece being positioned on the workpiece carrier to form a workpiece attachment site;

a first light irradiation means for irradiating one of the mask alignment marks and a mask pattern with at least one of a non-exposure light and an exposure light, wherein projection images of the alignment marks of the mask are imaged by exposure light emitted from the first light irradiation means;

a reflection component located on the workpiece carrier in a position removed from the workpiece attachment site;

a second light irradiation means for emitting light, wherein projection images of the workpiece alignment marks are illuminated by non-exposure light from one of said first light irradiation means and said second light irradiation means;

a camera means for recording the projection images of the mask alignment marks and workpiece alignment marks; and a control means for moving one of the mask and the workpiece based on projection image data recorded by the camera means and for controlling emission of the exposure light from the first light irradiation means, wherein the control means moves the workpiece carrier such that the reflection component is positioned in projection sites of the mask alignment marks and said workpiece is positioned outside of an optical path of said exposure light, said control means controlling the emission of exposure light from the first light irradiation means onto the mask, detecting the projection images of the mask alignment marks projected onto the reflection component, processing the projection images and determining and storing the relative positions of the mask alignment marks, wherein, when emission of the exposure light from the first irradiation means is stopped, the control means moves the workpiece into a position in which the alignment marks on the mask are projected onto the workpiece instead of said reflection component, the control means functioning to control emission of non-exposure light from at least one of the first light irradiation means and the second light irradiation means onto the workpiece alignment marks, to detect the alignment marks of the workpiece, to process the projection images and determine and store relative positions of the workpiece alignment marks, wherein the control means further computes data of the relative positions of the workpiece and mask alignment marks and moves at least one of the workpiece and the mask such that the workpiece and mask alignment marks come to rest on top of one another so as to position the mask relative to the workpiece.

4. A device for positioning a mask relative to a workpiece provided with alignment marks and several exposure zones, comprising:

a mask including alignment marks;

a mask carrier for supporting the mask;

a projection lens;

a workpiece carrier for supporting the workpiece, the workpiece being positioned on the workpiece carrier to form a workpiece attachment site;

a first light irradiation means for irradiating one of the mask alignment marks and a mask pattern with at least one of a non-exposure light and an exposure light, wherein projection images of the alignment marks of the mask are imaged by exposure light emitted from the first light irradiation means;

a reflection component located on the workpiece carrier in a position removed from the workpiece attachment site;

a second light irradiation means for emitting light, wherein projection images of the workpiece alignment marks are illuminated by non-exposure light from one of said first light irradiation means and said second light irradiation means;

a camera means for recording the projection images of the mask alignment marks and workpiece alignment marks; and a control means for moving the workpiece carrier by a stipulated amount during each movement which moves a respective exposure zone on the workpiece to an exposure position in steps, said control means moving one of the mask and the workpiece based on projection image data recorded by the camera means such that the mask alignment marks and workpiece alignment marks come to rest on top of one another, which thus positions the mask relative to the workpiece and which exposes the respective exposure zone on the workpiece in steps by irradiating the mask with exposure light, wherein the control means moves the workpiece carrier such that the reflection component is positioned in projection sites of the mask alignment marks and said workpiece is positioned outside of an optical path of said exposure light, said control means emitting exposure light from the first light irradiation part onto the mask, detecting the projection images of the mask alignment marks projected onto the reflection component, processing the projection images and determining and storing the relative positions of the mask alignment marks, wherein, when emission of the exposure light from the first light irradiation means is stopped, the control means moves the workpiece such that the exposure zones are positioned as articles to be exposed on the workpiece in projection sites of the mask alignment marks instead of said reflection component, the control means functioning to control emission of non-exposure light from at least one of the first light irradiation means and second light irradiation means onto the workpiece alignment marks, to detect the alignment marks of the workpiece alignment marks, to detect the alignment marks of the workpiece, to process the projection images and to determine and store relative positions of the workpiece alignment marks, wherein the control means computes data of the relative positions of the workpiece and mask alignment marks and moves at least one of the workpiece and the mask such that the workpiece and mask alignment marks come to rest on top of one another so as to position the mask relative to the workpiece.

5. Device for positioning a mask relative to a work piece, comprising:

means for emitting exposure light from a first light irradiation device onto alignment marks of the mask;

means for projecting the alignment marks of the mask onto a reflection component located on a workpiece carrier in a position at a projection site removed from a workpiece attachment site;

means for detecting said projection images and subjecting said projection images to image processing;

means for determining and storing relative positions of said projection images;

means for stopping emission of the exposure light from the first light irradiation device;

means for moving the workpiece carrier on which the workpiece is positioned into a position at the projection site in which the alignment marks on the mask are projected onto the workpiece instead of said reflection component;

means for emitting non-exposure light from one of the first light irradiation device and a second light irradiation device onto alignment marks of the workpiece;

detecting the alignment marks of the workpiece and subjecting the alignment marks of the workpiece to image processing;

determining and storing the relative positions of the alignment marks of the workpiece;

computing data of the relative positions of the alignment marks of the mask and the workpiece;

moving at least one of the workpiece and the mask such that the alignment marks of the mask and the workpiece come to rest on top of one another.

* * * * *